(12) United States Patent
Catabay et al.

(10) Patent No.: US 6,881,664 B2
(45) Date of Patent: Apr. 19, 2005

(54) PROCESS FOR PLANARIZING UPPER SURFACE OF DAMASCENE WIRING STRUCTURE FOR INTEGRATED CIRCUIT STRUCTURES

(75) Inventors: Wilbur G. Catabay, Saratoga, CA (US); Richard Schinella, Portland, OR (US); Zhihai Wang, Sunnyvale, CA (US); Wei-Jen Hsia, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 94 days.

(21) Appl. No.: 10/614,776

(22) Filed: Jul. 7, 2003

(65) Prior Publication Data

US 2004/0009668 A1 Jan. 15, 2004

Related U.S. Application Data (63) Continuation-in-part of application No. 09/941,440, filed on Aug. 28, 2001, now abandoned, which is a continuation-in-part of application No. 10/008,959, filed on Dec. 5, 2001, now abandoned.

(51) Int. Cl.[7] .................... H01L 21/4763; H01L 21/44
(52) U.S. Cl. .................. 438/631; 438/675; 438/692
(58) Field of Search ................. 438/631, 637, 438/675, 692

(56) References Cited

U.S. PATENT DOCUMENTS

| | | | |
|---|---|---|---|
| 3,012,861 A | 12/1961 | Ling | ................. 23/223.5 |
| 3,178,392 A | 4/1965 | Kriner | ................. 260/46.5 |
| 3,652,331 A | 3/1972 | Yamazaki | ................. 117/201 |

(Continued)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

(Continued)

*Primary Examiner*—David S. Blum
(74) *Attorney, Agent, or Firm*—John P. Taylor, Patent Attorney (57) ABSTRACT

A three step process for planarizing an integrated circuit structure comprising one or more dielectric layers having trench and/or via openings therein lined with a layer of electrically conductive barrier liner material and filled with copper filler material.

Sufficient excess copper (formed over the barrier liner portions on the top surface of the dielectric layer) is removed in an initial chemical mechanical polish (CMP) step to provide a planarized copper layer with a global planarity of about 20 nm to about 30 nm. The remainder of the excess copper over the portion of the barrier liner material lying on the top surface of the dielectric layer is then removed by electropolishing the structure, in a second step, until all of the excess copper over the portion of the barrier liner material lying on the top surface of the dielectric layer is removed. In a third step, all remaining portions of the diffusion barrier liner on the upper surface of the low k dielectric layer are then removed using a dry etching process selective to copper and the dielectric layer until all of the portions of the barrier layer over the top surface of the dielectric layer are removed; whereby the integrated circuit structure may be planarized by removal of all of the copper layer and barrier layer from the top surface of the dielectric layer while inhibiting dishing and/or erosion of the surface of copper filler material in the opening, and without risking distortion and/or delamination by the harsh effects of excessive CMP processing.

16 Claims, 8 Drawing Sheets

U.S. PATENT DOCUMENTS

| | | | |
|---|---|---|---|
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,854,126 A | 12/1998 | Tobben et al. | 438/626 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau | |
| 6,063,702 A | 5/2000 | Chung | |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,207,570 B1 | 3/2001 | Mucha | 438/692 |
| 6,215,087 B1 | 4/2001 | Akahori et al. | |
| 6,221,775 B1 | 4/2001 | Ference et al. | 438/691 |
| 6,232,658 B1 | 5/2001 | Catabay et al. | 257/701 |
| 6,383,917 B1 * | 5/2002 | Cox | 438/637 |
| 6,395,607 B1 | 5/2002 | Chung | 438/312 |
| 6,402,592 B1 * | 6/2002 | Zhu et al. | 451/36 |
| 6,403,466 B1 | 6/2002 | Loqatin | 438/627 |
| 6,440,295 B1 | 8/2002 | Wang | 205/640 |
| 6,447,668 B1 | 9/2002 | Wang | 205/645 |
| 6,653,226 B1 * | 11/2003 | Reid | 438/631 |
| 6,753,250 B1 * | 6/2004 | Hill et al. | 438/637 |

OTHER PUBLICATIONS

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$—Incorporated Silica Films for Interlayer Dielectric Application", 1999 Joint International Meeting, *Electrochemical Society Meeting Abstracts*, vol. 99–2, 1999, Abstract No. 746.

* cited by examiner

PROCESS FOR PLANARIZING UPPER SURFACE OF DAMASCENE WIRING STRUCTURE FOR INTEGRATED CIRCUIT STRUCTURES

CROSS-REFERENCE TO RELATED APPLICATIONS

This application is a Continuation-In Part application of Wilbur G. Catabay et al. U.S. patent application Ser. No. 09/941,440, filed Aug. 28, 2001, now abandoned. This application is also a Continuation-In-Part application of Richard Schinella U.S. patent application Ser. No. 10/008,959, filed Dec. 5, 2001.

BACKGROUND OF THE INVENTION

1. Field of the Invention

This invention relates to a process for forming integrated circuit structures with damascene structures having planarized upper surfaces. More particularly, this invention relates to a process for removal of excess portions of an electrically conductive diffusion barrier liner and a copper metallization filler layer on the upper surface of a dielectric layer having a damascene structure formed in and on the upper surface of the dielectric layer while inhibiting distortion and delamination of layers, and minimizing dishing and erosion effects in surfaces of copper interconnects formed using such damascene copper wiring structures lined with electrically conductive diffusion barrier material. In a preferred embodiment, the damascene wiring structure is formed in a layer of low k dielectric material.

2. Description of the Related Art

The shrinking of integrated circuits has resulted in levels of interconnects, including metal interconnects, being vertically placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is then annealed to remove moisture. Such carbon-containing silicon oxide insulating materials formed in this manner, sometimes referred to as low k carbon-doped silicon oxide dielectric material, exhibit good gap-filling capabilities and at the same time are characterized by a dielectric constant less than 3.0 and remain stable during subsequent annealing at temperatures of up to 500° C.

Many of the same reasons for turning to the use of dielectric materials having lower dielectric constants, e.g., for increased performance, including speed, have also led to the increased use of copper instead of aluminum or tungsten in the formation of metal interconnects, as well as via filler material, for integrated circuit structures.

But there are negative aspects to the choice of copper as the trench and/or via filler material in the formation of metal lines. Copper, when placed in direct contact with a dielectric layer, particularly a layer of low k dielectric material, will migrate into the dielectric material, thus necessitating the formation of a diffusion barrier liner between the copper filler and the dielectric layer.

Furthermore, while a layer of aluminum interconnects may be easily formed by depositing a layer of aluminum metal over a dielectric layer of an integrated circuit structure, followed by patterning of the aluminum layer through a mask to form aluminum interconnects, and subsequent deposition of dielectric material in the spaces between the metal interconnects, layers of copper interconnects are not so easily formed. This is due to difficulty in patterning (etching) of a previously deposited copper layer. This has lead to the development of processes commonly known as single damascene or dual damascene processes.

In the damascene processes the dielectric material which will separate the copper interconnects is first deposited as one or more dielectric layers in which trenches are then formed in the uppermost dielectric layer (usually through the entire thickness of the dielectric layer), corresponding to the desired pattern of copper interconnects. When a single damascene structure is desired, one or more electrically conductive barrier liner layers are then formed over the trench surfaces (as well as over the top surface of the dielectric layer), and a layer of copper is then deposited over the patterned dielectric layer and into the lined trenches, filling them completely. All surface copper is then removed, conventionally by a chemical mechanical polishing (CMP) process, followed by removal of surface portions of the barrier liner also using a CMP process, leaving the desired pattern of copper interconnects in the trenches, with the remaining portions of the dielectric layer forming the insulation between the copper interconnects.

In the formation of a dual damascene structure, the above process is modified to add a step comprising the formation of openings (vias) in a lower dielectric layer, usually in registry with trench openings formed in an upper dielectric layer. Both the via and trench openings are then lined with barrier material as described above, and then a blanket layer of copper is formed over the top surface of the upper layer of dielectric material, which fills both the vias and the trenches with copper, usually in a single deposition step.

While the use of copper-filled vias and copper interconnects, formed in one or more layers of low k carbon-doped silicon oxide dielectric material by the dual damascene process, has been found to be useful in reducing capacitance and increasing speed of integrated circuit structures utilizing such constructs, the conventional prior art chemical mechanical polishing (CMP) process used to remove the excess copper and barrier material from the upper surface of the top dielectric material to planarize the structure and to prevent shorts, also results in erosion and/or dishing of the copper in the trenches as the excess copper and barrier liner material is removed.

Figure 1:
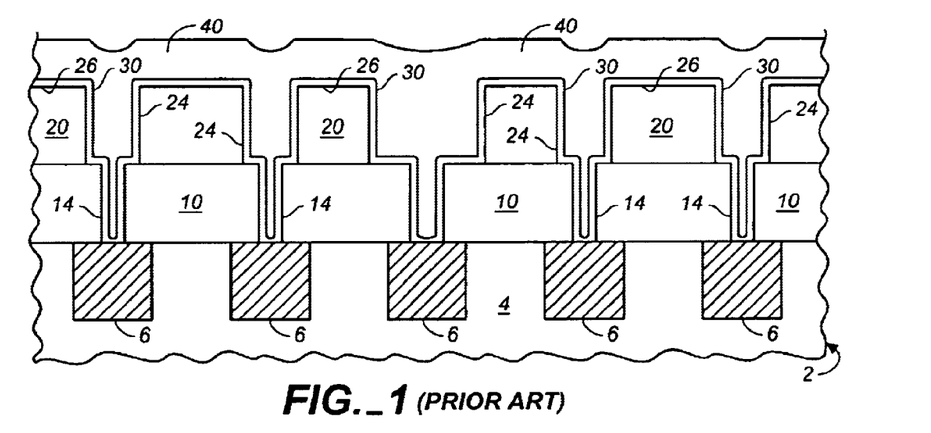
FIG. 1 is a fragmentary vertical cross-sectional view of a prior art integrated circuit structure comprising a dual damascene structure formed in upper and lower layers of dielectric material comprising trenches and vias which are lined with a layer of electrically conductive barrier material and filled with a layer of copper prior to planarization to remove excess portions of the barrier layer and the copper layer over the top surface of the upper dielectric layer.

Prior art FIGS. 1–4 illustrate the problems of erosion and dishing of the copper. FIG. 1 show a typical dual damascene structure formed over an integrated structure generally indicated at 2 comprising a layer 4 of dielectric material and electrically conductive portions 6 comprising lower level metal interconnects or filled vias, or filled contact openings. The dual damascene structure comprises a lower dielectric layer 10 having vias 14 formed therethrough and an upper dielectric layer 20 with trenches 24 formed therein in registry with vias 14. An electrically conductive barrier liner 30 is shown lining the exposed surfaces of vias 14 and trenches 24 and extending over the upper surface 26 of upper dielectric layer 20. A copper filler layer 40 is shown filling the lined vias 14 and lined trenches 24 and extending over the upper surface of those portions of underlying barrier liner 30 on upper surface 26 of upper dielectric layer 20.

Figure 2:
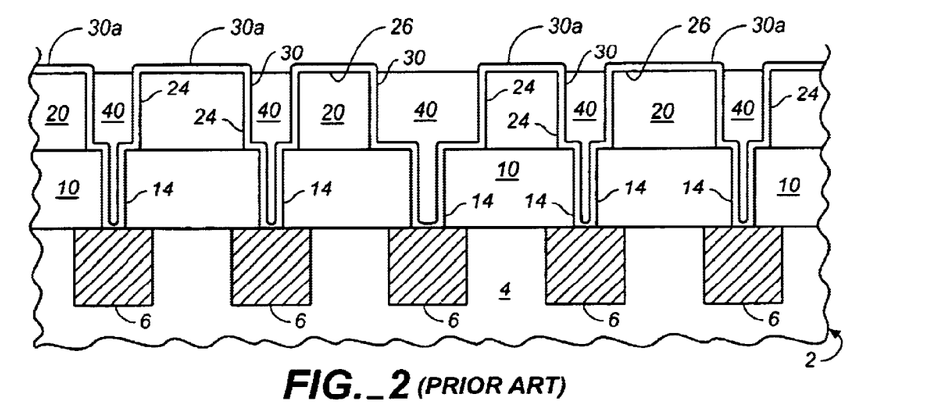
FIG. 2 is a fragmentary vertical cross-sectional view of the prior art dual damascene structure of FIG. 1 after removal by chemical mechanical polishing (CMP) of the copper layer portions lying over the barrier layer on the top surface of the upper dielectric layer.

Prior art FIG. 2 shows the structure of FIG. 1 after the structure has been subjected to a conventional prior art chemical mechanical polishing (CMP) step to remove all of copper layer 40 on the surface of those portions of barrier liner 30 formed over the upper surface 26 of upper dielectric layer 20, with those portions of barrier layer 30 on upper surface 26 of dielectric layer 20 yet to be removed.

Figure 3:
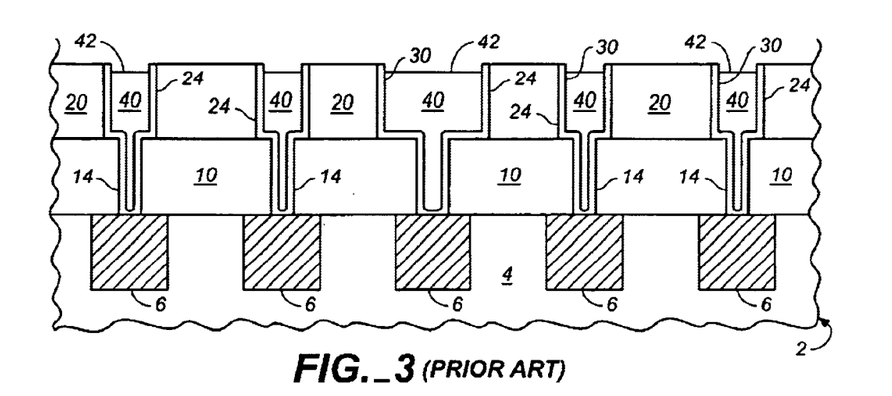
FIG. 3 is a fragmentary vertical cross-sectional view of the prior art dual damascene structure of FIG. 2 after removal by CMP of the barrier layer on the top surface of the upper dielectric layer, showing erosion of the surface of the copper in the trenches resulting from the complete removal of the barrier layer portions on the top surface of the upper layer of dielectric material by CMP.
Figure 4:
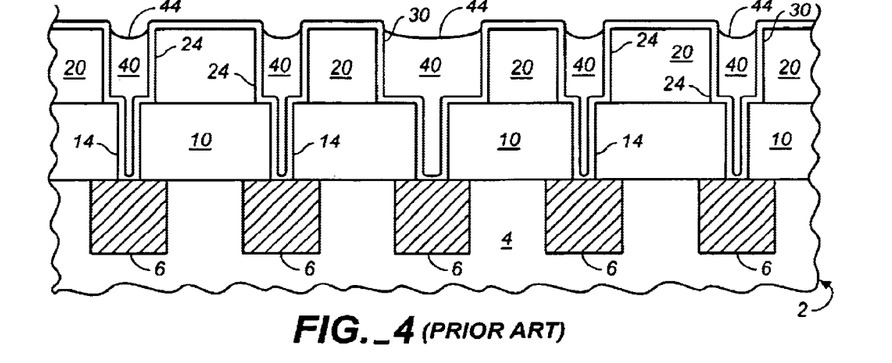
FIG. 4 is a fragmentary vertical cross-sectional view of the prior art dual damascene structure of FIG. 2 after removal by CMP of the barrier layer on the top surface of the upper dielectric layer, showing dishing of the surface of the copper in the trenches resulting from the complete removal of the barrier layer portions on the top surface of the upper layer of dielectric material by CMP.

Prior art FIGS. 3 and 4 show the structure of FIG. 2 after removal of all of barrier liner 30 on upper surface 26 of dielectric layer 20. FIG. 3 illustrates, at 42, the problem of erosion of the surface of the copper in the trench caused by the CMP process used in the removal of those portions of copper layer 40 and barrier liner 30 lying on upper surface 26 of dielectric layer 20, while FIG. 4 shows, at 44, the problem of dishing of the surface of the copper in the trench also caused by the same CMP process. It should be noted that while the problems of erosion and dishing have been shown separately in FIGS. 3 and 4, for illustrative purposes, both problems may occur in the same integrated circuit structure, depending upon the width of the particular copper line.

Furthermore, the conventional prior art chemical mechanical polishing (CMP) process used to remove the excess copper and barrier material from the upper surface of the top dielectric material and to planarize the structure, can also promote defects in the layer or layers of such low k dielectric materials such as cracks and/or delamination, due to the wafer pressure and the sheer strength of the polishing process. Sometimes even though the low k dielectric film makes it through the CMP process without cracking, the low k dielectric film may crack during later processing due to the stresses created during the CMP processing.

Delamination can occur between the low k dielectric layer and the diffusion barrier liner, as well as between the diffusion barrier liner and the copper layer. This failure mode may be experienced to some degree whenever the damascene process is employed with subsequent CMP processing then used to remove the portions of the copper layer and the diffusion barrier liner remaining on the upper surface of the insulation material.

Delamination or distortion at these interfaces can produce weakness and defects in the barrier liner layer or film which can result in electromigration failures and in failure of the copper diffusion barrier liner to act as a barrier. Diffusion of copper through defects in the diffusion barrier liner can result in electrical failure through electrical leakage and shorts, and to contamination of the underlying transistors.

Figure 5:
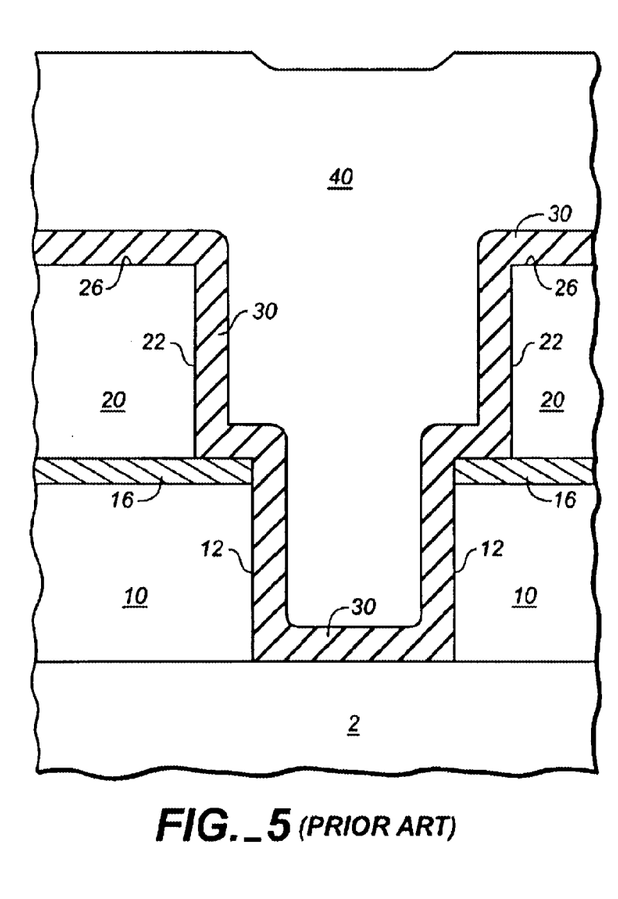
FIG. 5 is a fragmentary vertical cross-sectional view of a prior art dual damascene structure showing a via opening in a first dielectric layer and a trench opening in a second dielectric layer with an electrically conductive diffusion barrier liner on the walls of the trench and via openings and a copper filler filling the remainder of the trench and via openings, and excess diffusion barrier liner and copper filler shown on the upper surface of the second dielectric layer.
Figure 6:
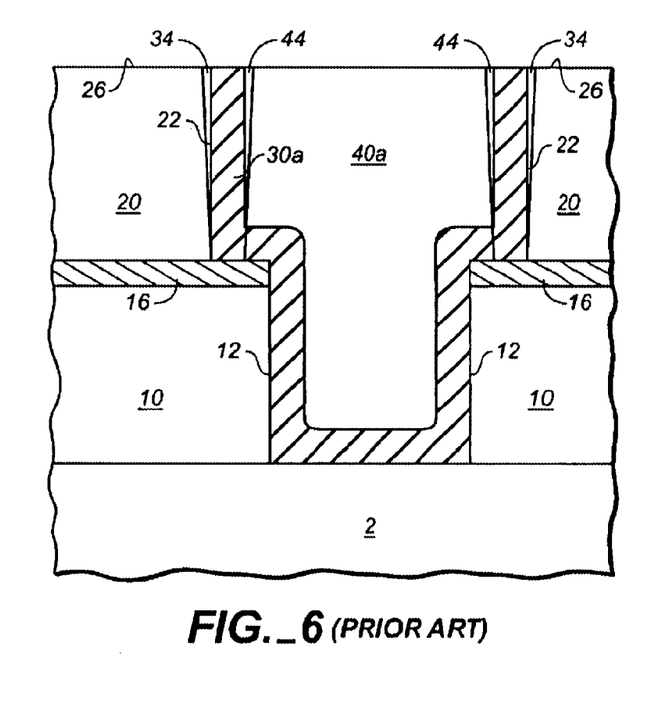
FIG. 6 is a fragmentary vertical cross-sectional view of the prior art dual damascene structure of FIG. 5 after removal, by chemical mechanical polishing (CMP), of the excess diffusion barrier liner and copper filler over the upper surface of the second dielectric layer, showing the occurrence of delamination between the dielectric material and the liner, and between the liner and the copper filler cause by the CMP process.
Figure 7:
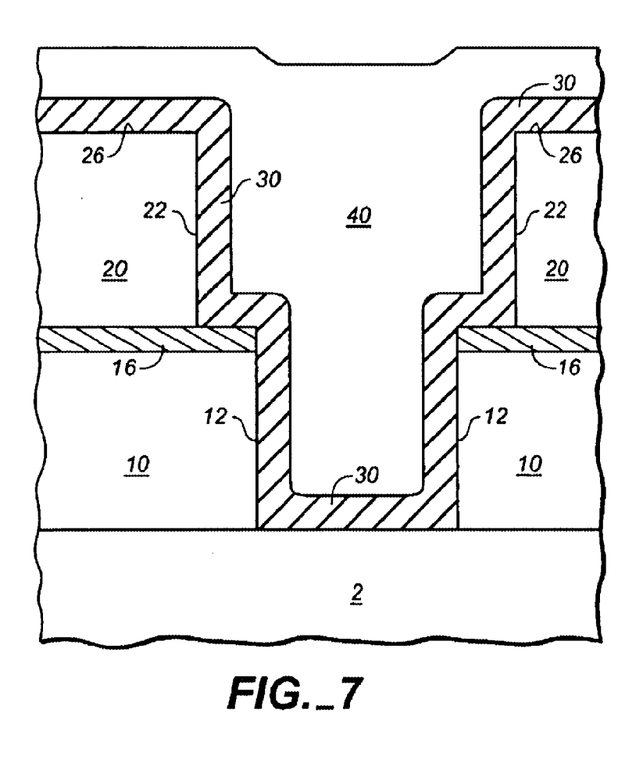
FIG. 7 is a fragmentary vertical cross-sectional view of a dual damascene structure after removal, in accordance with the invention, by chemical mechanical polishing (CMP), of a selected portion of the total thickness of the excess copper over the portion of the barrier liner material lying on the top surface of a dielectric layer.
Figure 8:
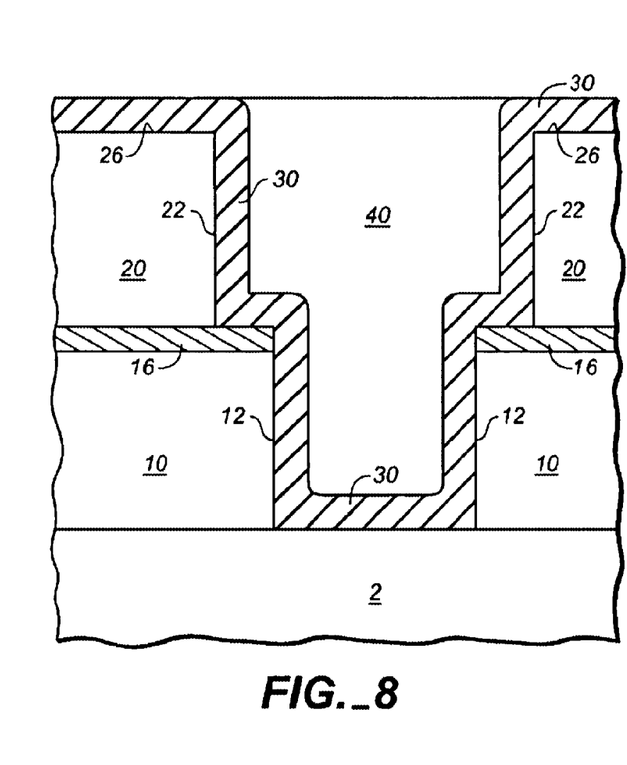
FIG. 8 is a fragmentary vertical cross-sectional view of the dual damascene structure of FIG. 7 after removal, by electropolishing, of the remainder of the copper layer over the portion of the barrier liner material lying on the top surface of the dielectric layer.

Prior art FIGS. 5–6 illustrate the problems of distortion and delamination in general, using a dual damascene structure to demonstrate these problems. FIG. 5 show a typical dual damascene structure formed over an integrated structure generally indicated at 2, prior to removal of excess material used to line and fill the vias and trenches in the dual damascene structure. The dual damascene structure comprises a lower dielectric layer 10 having a via 12 formed therethrough, an etch stop layer 16, and an upper dielectric layer 20 with a trench 22 formed therein in registry with via 12. An electrically conductive diffusion barrier liner 30 is shown lining the exposed surfaces of via 12 and trench 22 and extending over the upper surface 26 of upper dielectric layer 20. A copper filler layer 40 is shown filling lined via 12 and lined trench 22 and extending over the upper surface of those portions of underlying diffusion barrier liner 30 on the upper surface 26 of upper dielectric layer 20.

Prior art FIG. 6 shows the structure of FIG. 5 after the structure has been subjected to a conventional prior art chemical mechanical polishing (CMP) step to remove all of copper layer 40 on the surface of those portions of diffusion barrier liner 30 formed over the upper surface 26 of upper dielectric layer 20, and with those portions of diffusion barrier layer 30 on upper surface 26 of dielectric layer 20 also removed by a CMP process, leaving only diffusion barrier liner 30a and copper filler 40a in via 12 and trench 22.

It will be noted that delamination is shown in FIG. 6 (in exaggerated form for illustrative purposes) at 34 between trench 22 in low k dielectric layer 20 and diffusion barrier liner 30a; and also at 44 between diffusion barrier liner 30a and copper filler 40a. As mentioned above, such delamination at these interfaces can produce weakness and defects in the barrier liner film which can result in electromigration failures and in failure of the diffusion barrier liner to act as a diffusion barrier to prevent copper migration. This can result in diffusion of copper through such defects in the diffusion barrier liner layer which can, in turn, result in electrical failure through electrical leakage and shorts, and to contamination of the underlying transistors.

All of the problems just discussed are further exacerbated by the fact that all of top portions 30a of barrier liner 30, shown in FIG. 2, must be removed from surface 26 of dielectric layer 20, since barrier liner 30 comprises an electrically conductive material and failure to remove all of the surface portions 30a of barrier liner 30 would result in electrical shorts between adjacent metal interconnects comprising copper-filled trenches 24.

Ference et al. U.S. Pat. No. 6,221,775 teach a process of planarizing the surface of a dielectric layer on a semiconductor substrate having raised and recessed regions on the surface of the dielectric layer as a resulting of the forming and filing of trenches and vias in the dielectric layer. An etch stop or "polish stop" layer is first formed over the patterned raised and recessed regions, and (optionally) a barrier layer is then deposited over all of the underlying surfaces, including the surfaces of the trenches and vias and the upper surface of the dielectric layer. A layer of metal such as tungsten, copper, or aluminum is then deposited over the barrier layer to a thickness sufficient to completely fill the trenches and/or vias. The resulting stack is then subject to two planarization steps, the first of which is a chemical mechanical polishing (CMP) process, and the second of which is said to be a reactive ion etch (RIE).

The Ference et al. '221 patent describes three embodiments for carrying out their two step process. In the first embodiment, the stack is subject to a CMP process to planarize it, but the step of planarization by CMP is stopped before any exposure of the liner, and the planarization is then completed by the RIE step. In the second embodiment, the CMP process is again used but the slurry in the CMP process is selective to the liner, i.e., the material in the conductive layer etches at a faster rate than the liner material. The CMP process in this embodiment is stopped after removing all excess conductor material, but before removing all of the excess liner. In both embodiments, all remaining liner, as well as any remaining conductor, are removed using RIE. In a third embodiment, a traditional CMP process is performed to remove both the liner and conductive layers and to thereby expose the surface of the underlying dielectric layer. A touch-up CMP process is then performed to remove scratches as necessary. Then the RIE step is applied to remove metal in eroded regions of prior scratches.

Wang U.S. Pat. No. 6,440,295 describes an electropolishing apparatus for polishing a metal layer formed on a wafer (31) and includes an electrolyte (34), a polishing receptacle (100), a wafer chuck (29), a fluid inlet (5, 7, 9), and at least one cathode (1, 2, 3). The wafer chuck (29) holds and positions the wafer (31) within the polishing receptacle (100). The electrolyte is delivered through the fluid inlet into the polishing receptacle. The cathode then applies an electropolishing current to the electrolyte to electropolish the wafer. In accordance with one aspect of the present invention, discrete portions of the wafer can be electropolished to enhance the uniformity of the electropolished wafer. Wang further teaches the use of a chemical-mechanical polishing (CMP) process to remove remaining portion of the metal (copper) layer and the underlying electrically conductive barrier layer. Wang also states that in substitution for use of the CMP process for the removal of the remainder of the excess copper layer and layer of electrically conductive, one may etch away the remaining metal layer and barrier layer using any convenient etching process.

Chung U.S. Pat. No. 6,395,607 describes a microelectronic device wherein a trench having inside walls is formed through a dielectric layer. A lining of a barrier metal is deposited on the inside walls of the trench, and the lined trench is then filled with a fill metal. The fill metal and the barrier metal are said to have substantially different removal selectivities. After filling the trench with the fill metal, excess portions of the fill metal over the top surface of the dielectric layer are then removed with a conventional etch such as a chemical/mechanical/polishing etch (CMP) etch.

Chung then forms a recess or dished portion in the end of his fill metal. Chung states that the this recess may be formed by a proper combination of chemical mechanical polishing (CMP), plasma etch, wet etch, or electropolishing, without identifying what this combination might be. A further layer of the barrier metal is then deposited over the first barrier metal layer and filing up the recess, thereby completely encapsulating the fill metal. The excess barrier metal is then removed from over the top of the dielectric layer by chemical mechanical polishing (CMP), plasma etching, wet etch, or electropolishing.

It would, however, be desirable to provide a process wherein copper interconnects and copper-filled vias could be formed in dielectric material, including low k carbon-doped silicon oxide dielectric material, while inhibiting or eliminating the problems of dishing/erosion of the surface of copper filler material in the trenches during removal of surface portions of the barrier liner material and planarizing of the structure, as well as the problems of distortion and delamination of the layers due to the planarization methods used to remove the excess copper filler material and electrically conductive liner material.

SUMMARY OF THE INVENTION

A process for planarizing an integrated circuit structure comprising one or more dielectric layers having trench and/or via openings therein lined with a layer of electrically conductive barrier liner material and filled with copper filler material. In a preferred embodiment, the process consists essentially of a three step process wherein a sufficient amount of the excess copper over the portion of the barrier liner material lying on the top surface of a dielectric layer is removed in the first step by a chemical mechanical polish (CMP) process step to provide a global planarity of about 20 to 30 nanometers (nm). That is, the variation in the thickness of the copper layer after the initial CMP process step does not vary more than from about 20 nm (200 Angstroms) to about 30 nm (300 Angstroms). The remainder of the excess copper over the portion of the barrier liner material lying on the top surface of the dielectric layer is then removed by electropolishing the structure until all of the excess copper over the portion of the barrier liner material lying on the top surface of the dielectric layer is removed. In a third step, all remaining portions of the diffusion barrier liner on the upper surface of the one or more low k dielectric layers are then removed using a dry etching process selective to copper and the dielectric layer until all of the portions of the barrier layer over the top surface of the dielectric layer are removed; whereby the integrated circuit structure may be planarized by removal of all of the copper layer and barrier layer from the top surface of the dielectric layer while inhibiting dishing and/or erosion of the surface of copper filler material in the opening, and without risking distortion and/or delamination by the harsh effects of excessive CMP processing.

DETAILED DESCRIPTION OF THE INVENTION

The invention comprises a process for planarizing an integrated circuit structure comprising a dielectric layer having openings therein, such as trenches or vias, lined with a layer of electrically conductive barrier liner material and filled with copper filler material wherein erosion and dishing of the copper in the openings, and distortion and delamination of the layers is inhibited during planarizing of the structure to remove excess copper and barrier liner material over the upper surface of the dielectric layer.

In the preferred embodiment, the process of the invention is a three step process consisting essentially of first removing, by a chemical mechanical polish (CMP) first process step, an amount of the excess copper, over the portion of the barrier liner material lying on the top surface of a dielectric layer, sufficient to provide a global planarity of about 20 to 30 nanometers (nm). That is, the variation in the thickness of the copper layer after the initial CMP process step does not vary more than from about 20 nm (200 Angstroms) to about 30 nm (300 Angstroms). Then the excess copper over the portion of the barrier liner material lying on the top surface of the dielectric layer is electropolished until at least until all of the excess copper over the portion of the barrier liner material lying on the top surface of the dielectric layer is removed. Finally, in a third step, all remaining portions of the diffusion barrier liner on the upper surface of the one or more low k dielectric layers are removed using a dry etching process selective to copper and the dielectric layer until all of the portions of the barrier layer over the top surface of the dielectric layer are removed. The integrated circuit structure may thus be planarized by removal of all of the copper layer and barrier layer from the top surface of the dielectric layer while inhibiting dishing and/or erosion of the surface of the copper filler material in the opening, by the three step removal process, and without risking distortion and/or delamination by the harsh effects of excessive CMP processing.

a. The Use of Low k Dielectric Material in which to form the Trenches and Vias

The layer of dielectric material in which the trench and via openings are formed may comprise silicon oxide or silicon nitride, but preferably comprise a low k dielectric material such as the low k dielectric material formed by reaction of methyl silane with hydrogen peroxide as described in the previously cited Peters article. The dielectric material may also comprise a low k dielectric material such as described in U.S. Pat. No. 6,303,0474, issued Oct. 16, 2001, and assigned to the assignee of this application, the subject matter of which is hereby incorporated herein by reference.

The dielectric material may also comprise the reaction product of an oxidizing agent with an organofluoro silane such as described in U.S. Pat. No. 6,365,528, (issued Apr. 2, 2002) and in U.S. Pat. No. 6,572,925, (issued Jun. 3, 2003) and also in U.S. patent application Ser. Nos. 09/792,685; and 09/792,691, all filed on Feb. 23, 2001. All four of these cases are assigned to the assignee of this application, and the subject matter of all four cases is hereby incorporated herein by reference.

By use of the term "low k" herein, with respect to the dielectric constant of a dielectric material, is meant a dielectric constant below 4.0, preferably below about 3.5, and most preferably below about 3.0.

The "openings" in the dielectric material to be lined by barrier material and then filled with copper may comprise vias, for example, which connect to a lower level of metal interconnects; or contact openings, for example, which extend down to the contacts of an active device of the integrated circuit structure; or trenches, for example, which may comprise a part of a damascene or dual damascene structure to be used in the formation of a copper interconnect structure. The use of the term "vias" herein will be understood to include "contact openings" as well.

b. The Liner Material Used to Line the Trenches and Vias to Separate the Copper Metal Filler from the Dielectric Material Since copper is known to migrate into the sidewalls of a dielectric material when the copper is used as an electrically conductive filler material to fill openings in the dielectric material, a layer of a barrier material is used to line the surfaces of the dielectric material to inhibit such copper migration. The barrier material used to line the exposed surfaces of the dielectric material must be capable of preventing migration of copper atoms into the dielectric material. Furthermore, since the liner material will also form over the bottom of the opening, e.g., trench, it is also important that the barrier material be electrically conductive. Furthermore, the barrier material must be capable of providing good bonding between the dielectric material and the barrier liner, as well as between the barrier liner and the copper filler material. Finally, in accordance with the invention, the barrier material must be etchable by an etching system which is selective to both copper and the dielectric material, i.e., an etching system which will etch the barrier material in preference to etching either the dielectric material or copper. Examples of barrier layer material having the above attributes include tantalum, tantalum nitride, titanium silicon nitride, tungsten, and tungsten nitride.

The liner of barrier material is blanket deposited over the layer of dielectric material having the openings formed therein to a conventional thickness varying from about 3 nanometers (nm) to about 50 nm, in accordance with prior art techniques well known to those skilled in the art.

A layer of copper metal is then blanket deposited over the layer of dielectric material having the openings lined with barrier material thereon. Sufficient copper is deposited thereon to ensure complete filling of the lined openings. The excess copper, deposited over the barrier material formed on the top surface of the layer of dielectric material, is then removed in two steps, in accordance with the preferred embodiment of the invention.

c. The Chemical Mechanical Polishing (CMP) First Step of the Planarization Process The first step of the preferred embodiment of the process of the invention, which is used to quickly remove the rough surface upper portions of the copper layer, is carried out using a conventional chemical mechanical polishing (CMP) process which may be a non-selective process such as a CMP process using a peroxide-based polishing slurry material such as iCue5001. commercially available from Cabot. This initial step comprises first removing, by a chemical mechanical polish (CMP), an amount of the excess copper, over the portion of the barrier liner material lying on the top surface of a dielectric layer, sufficient to provide a global planarity of about 20 to 30 nanometers (nm). That is, the variation in the thickness of the copper layer after the initial CMP process step does not vary more than from about 20 nm (200 Angstroms) to about 30 nm (300 Angstroms). Typically, for a copper layer of from about 500 nm to about 600 nm in thickness, this will comprise removing from about 10% to about 50% of the total thickness of the excess copper over the portion of the barrier liner material lying on the top surface of a dielectric layer. The above percentages are measured from the peaks of the copper layer down to the underlying liner of barrier material, and the time necessary to remove that amount of copper may be determined empirically.

It should be noted that the reason for the use of the initial CMP step is not to remove all of the copper layer, but rather to utilize the CMP process to planarize the upper copper surface by quickly removing some of the upper portions of the copper layer. While the speed of the CMP process in removing an initial portion of the copper, and the selectivity of the electropolish in removing the remainder of the copper in a manner which inhibits delamination or distortion are both advantageous, there is an additional benefit to this combination of processes for removing the excess copper.

The electropolish process is a very conformal process. Thus, if the surface of the excess copper to be removed is not planar before the electropolish step, it will not be planar after the electropolish step, thus, complicating complete removal of the excess copper. However, by first subjecting an initially unplanarized layer of excess copper to the CMP process, the surface of the excess copper is first planarized (by the CMP process) and then the balance of the excess copper is removed by the conformal electropolish process. The initial CMP process thus quickly removes a first portion of the excess copper, while also planarizes the copper surface, while permitting the remaining planarized portions of the layer of excess copper to be removed by the more accurate, but conformal, electropolishing second step of the process. That is, the use of the combination of the CMP step and the electropolishing step (to remove those portions of the copper filler material deposited over the top side of the dielectric layer) will result in a faster and yet just as accurately controlled removal of the copper than the use of either step alone for the copper removal.

d. The Electropolishing Second Step of the Planarization Process

The second step of this preferred embodiment of the process of the invention is the accurate removal, by electropolishing, of the remainder of the copper layer over the liner of barrier material on the top surface of the dielectric material. In accordance with this embodiment of the invention, those portions of the copper filler remaining over the upper surface of the dielectric layer after the initial CMP step are removed by an electropolishing step. The electropolishing step is carried out by immersing the damascene structure in an electrolytic bath of acidic chemical reagents such as, for example, a copper sulfate bath. The silicon substrate is connected to the positive electrode (anode) of a DC power supply with a counter electrode, such as a platinum electrode, also immersed in the electrolyte bath, and connected to the negative electrode of the DC power supply, serving as the cathode in the electrolytic bath. This second step of the process is carried out until all of the copper filler material lying on the diffusion barrier liner over the top surface of the dielectric layer is removed, leaving only those portions of the original copper filler material which are in the vias and trenches by the electropolishing step of the preferred embodiment of the process of the invention.

The DC power supply used in the electropolishing step should be capable of proving a DC voltage up to about 5 volts DC to thereby allow the electropolishing step to be carried out at a DC voltage ranging from about 0.5 volts DC up to about 5 volts DC. In some instances a higher voltage might be used, but care must be taken not to damage the integrated circuit structure already formed on the silicon substrate. The time for the electropolishing step will range from about 10 seconds up to about 10 minutes, preferably from about 10 seconds to about 5 minutes, with the exact time dependent upon the thickness of the material to be removed during the electropolishing step, and the particular material being removed. It will be understood by those skilled in the art that the voltage and time of the electropolishing step are interrelated and that both are, in turn, dependent on the thickness of the metal to be removed by the electropolishing step. For any given thickness and type of metal to be removed, the optimum time and DC voltage may be determined empirically. The end point for the electropolishing step of the process of the invention may be determined optically, or by monitoring the current flow, or by empirical means as well.

In some instances the electropolishing step is continued after all of the copper metal filler on the upper surface of the uppermost low k dielectric layer has been removed to also remove some of the portions of an underlying electrically conductive diffusion barrier liner also lying on the upper surface of the upper low k dielectric layer as well. For example, when a copper filler is used, a diffusion barrier liner of an electrically conductive material such as tantalum, tantalum nitride, titanium silicon nitride, tungsten, tungsten nitride, titanium, titanium nitride, and manganese dioxide will be formed on the walls of openings in the low k dielectric layers to inhibit migration of the copper filler into the low k dielectric material. If desired, the electropolishing step could also be used to remove at least some of the excess portions of such barrier liner lying over the upper surface of the upper low k layer.

e. The Dry Etch Third Step of the Planarization Process

However, such removal of the diffusion barrier liner by the electropolishing step could result in removal of excessive amounts of the copper filler as well, resulting in dishing of the upper surface of the copper in the opening. Therefore, in the preferred embodiment of the invention, after removal of the copper filler metal by the electropolishing step, the substrate is removed from the electropolishing bath, rinsed, dried, and moved to a dry plasma etching chamber to remove the electrically conductive diffusion barrier liner material by dry plasma etching. This move from an electropolishing process to a dry plasma etch process for removal of the electrically conductive diffusion barrier liner is preferred because of the higher selectivity of the dry plasma etch process to copper than the electropolishing step. That is, the rate at which the dry plasma etching step will remove the barrier liner to the rate at which the dry plasma etching process will remove the copper filler is much higher that the same ratio of the respective rates of removal for removal of the barrier liner to removal of copper by the electropolishing process.

The plasma power, pressure, temperature, etch time, and selective etch chemistry used in the dry plasma etching step of the invention will vary with the particular electrically conductive diffusion barrier liner used, as well as the thickness of the diffusion barrier liner.

The selective etching materials utilized in the dry etching step of the process of the invention may comprise, for example, one or more of $Cl_2$, $CF_4$, $SF_6$, $C_4F_8$, and $BCl_3$. The flow rates of each of the respective gases into the etching reactor, in standard cubic centimeters per minute (sccm), may range from about 1 sccm to about 1000 sccm.

The pressure in the dry etch reactor to which the integrated circuit structure is moved, may range from about 3 millitorr to about 1000 millitorr during the dry etch. The temperature of the substrate support on which the substrate carrying the integrated circuit structure is mounted should be maintained within a range of from about −50° C. to about 100° C. during the etch. The plasma in the dry etch reactor should remain within a power level range of from about 5 watts to about 1500 watts during the etch. The substrate may be grounded, left floating, or biased during the etch.

The dry etch is carried out until all of the electrically conductive barrier liner material has been removed from the top surface of the dielectric layer to ensure that there will be no shorting between adjacent metal interconnects through any barrier liner residues left on the top surface of the dielectric layer. The end point can be monitored optically using a laser-based monochromator to detect the surface reflectance change as the copper is removed. Alternatively, the end point can be determined empirically by measuring both for erosion of the copper surface in the opening (indicative of over etching) versus presence of barrier material still on the upper surface of the dielectric layer determined by shorting (indicative of under etching). A time polish could also be used based on a previous empirically determined polish time.

Upon satisfactory removal of the remaining barrier liner material from the top surface of the dielectric layer containing the copper-filled openings, the integrated circuit structure is ready for further conventional processing such as the deposition of a further layer of dielectric material over the copper interconnect layer.

EXAMPLE 1

The Preferred Embodiment

The following example illustrates the preferred 3 step embodiment of the process of the invention. A substrate can be prepared with a damascene structure formed in a dielectric layer thereon having a pattern of trenches formed in the dielectric layer. A 20 nm thick tantalum liner is then blanket deposited over the substrate to line the trench surfaces on the substrate with tantalum barrier material. An 800 nm thick layer of copper metal is then blanket deposited over the substrate to fill all of the tantalum-lined trenches with copper filler. The substrate is then subject to a CMP processing using a peroxide-based polishing slurry material such as iCue5001, commercially available from Cabot, to remove sufficient excess copper (formed over the barrier liner portions on the top surface of the dielectric layer) to provide a planarized copper layer with a global planarity of about 20 nm to about 30 nm.

The substrate is then, in a second step, subject to an electrochemical polishing step wherein those portions of the copper filler remaining over the upper surface of a low k dielectric layer are removed by an electropolishing process wherein the damascene structure, including the silicon substrate on which the damascene structure is constructed, is immersed in an electrolytic bath of acidic chemical reagents such as, for example, a copper sulfate bath. The silicon substrate is connected to the positive electrode (anode) of a DC power supply with a counter electrode, such as a platinum electrode, also immersed in the electrolyte bath, and connected to the negative electrode of the DC power supply, serving as the cathode in the electrolytic bath.

The DC power supply used in this second step of the invention should be capable of proving a DC voltage up to about 5 volts DC to thereby allow the electropolishing step to be carried out at a DC voltage ranging from about 0.5 volts DC up to about 5 volts DC. In some instances a higher voltage might be used, but care must be taken not to damage the integrated circuit structure already formed on the silicon substrate. The time for the electropolishing step will range from about 10 seconds up to about 10 minutes, preferably from about 10 seconds to about 5 minutes, with the exact time dependent upon the thickness of the material to be removed during the electropolishing step, and the particular material being removed. It will be understood by those skilled in the art that the voltage and time of the electropolishing step are interrelated and that both are, in turn, dependent on the thickness of the metal to be removed by the electropolishing step. For any given thickness and type of metal to be removed, the optimum time and DC voltage may be determined empirically. The end point for the electropolishing step of the process of the invention may be determined optically, or by monitoring the current flow, or by empirical means as well.

Figure 9:
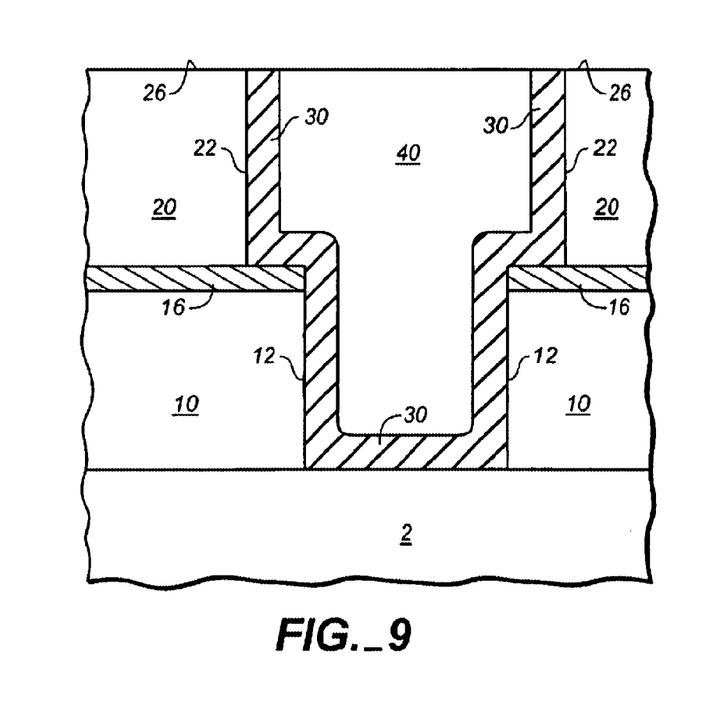
FIG. 9 is a fragmentary vertical cross-sectional view of the dual damascene structure of FIG. 8 after removal, by plasma etching, of the portion of the barrier liner material lying on the top surface of the dielectric layer.
Figure 10:
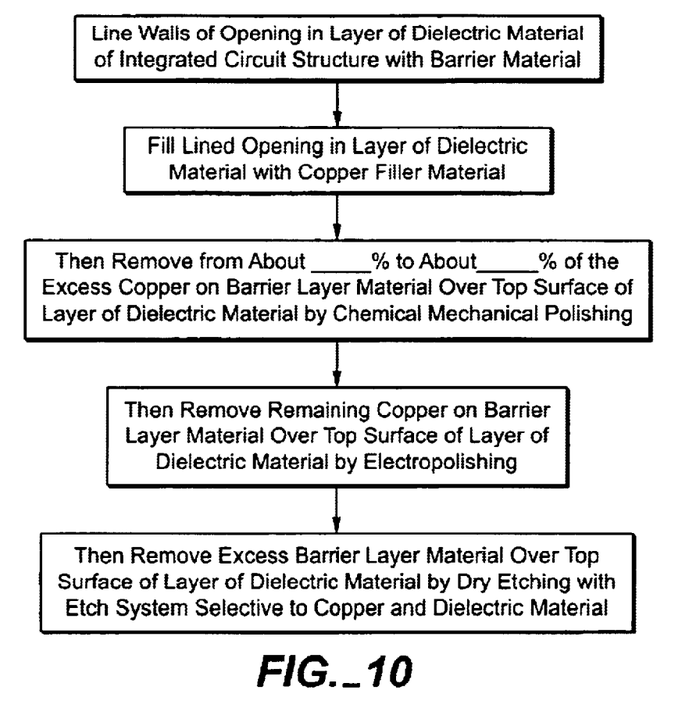
FIG. 10 is a flowsheet illustrating the preferred embodiment of the process of the invention as shown in FIGS. 7–9.

The structure is then subjected to a plasma etching third step of the process by placing the substrate on a grounded substrate support in a dry etch reactor into which is flowed a mixture of $Cl_2$ and $BCl_3$ at a flow rate of about 100 sccm $Cl_2$ and 50 sccm $BCl_3$. While maintaining a pressure of about 10 millitorr and a substrate support temperature of about 50° C., a plasma is ignited in the reactor and maintained at a power level of about 1000 watts, while the etch is monitored monochromatically. When the monitoring system indicates that all of the barrier material on the top surface of the dielectric layer has been removed, the plasma is extinguished. The substrate processed in accordance with this embodiment of the process of the invention is then removed from the dry etch reactor free of any copper or barrier liner on the top surface of the dielectric layer, as shown in FIG. 9.

The upper surface of the copper filler material in the lined trenches of each of the substrates can then be examined for evidence of erosion and/or dishing using a step height measurement tool such as a Veeco Atomic Force Profiler. It will be found that the surfaces of the copper filler in the trenches of the substrate processed in accordance with the invention have little if any evidence of either erosion or dishing, while the copper surfaces in the trenches in the control substrate having the barrier liner material removed by conventional CMP processing will show evidence of both erosion and dishing.

EXAMPLE 2

Another Embodiment

Figure 11:
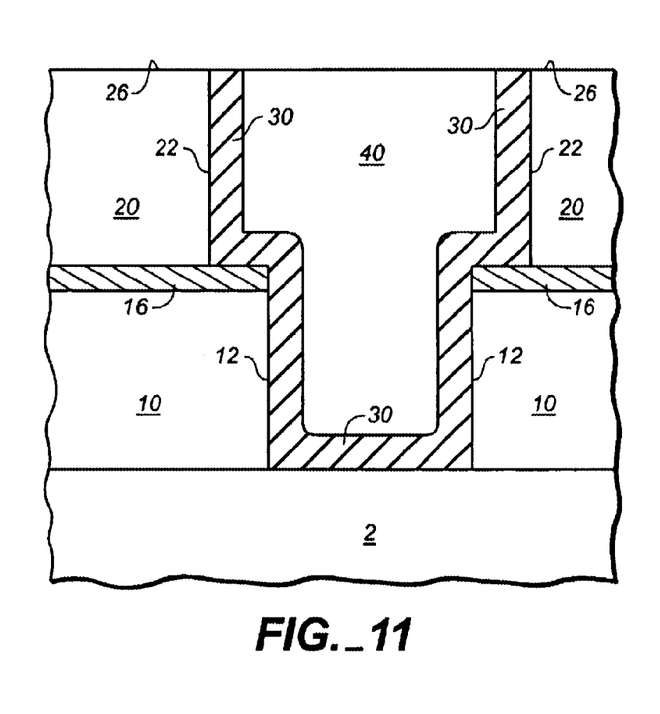
FIG. 11 is a fragmentary vertical cross-sectional view of a dual damascene structure similar to the prior art dual damascene structure of FIG. 2, but after treatment in accordance with a second embodiment of the invention comprising removal, by selective dry etching, of the barrier layer on the top surface of the upper dielectric layer, after prior removal, by CMP, of the copper layer over the barrier layer on the top surface of the upper dielectric layer, showing the absence of erosion and dishing of the surface of the copper in the trenches despite the complete removal of the barrier layer portions on the top surface of the upper layer of dielectric material.
Figure 12:
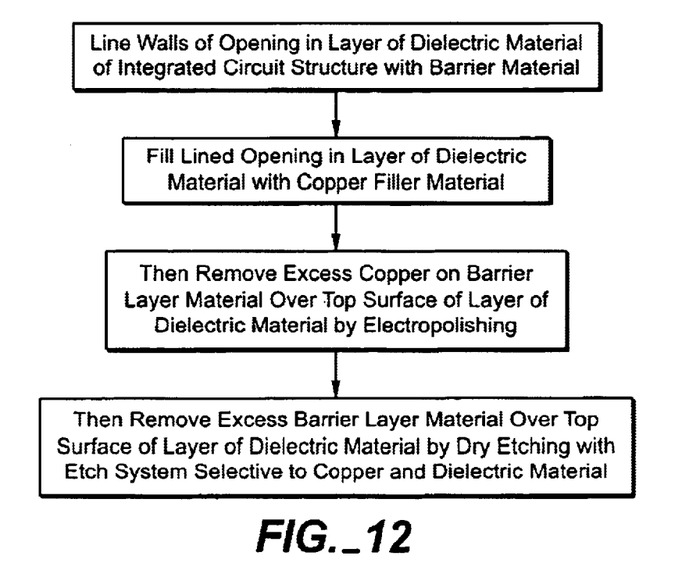
FIG. 12 is a flow sheet illustrating this second embodiment of the process of the invention.

In accordance with another embodiment of the invention, as illustrated in FIGS. 11 and 12, at least those portions of the copper filler layer over the upper surface of a low k dielectric layer of a damascene structure are removed by electropolishing by immersing the damascene structure, including the silicon substrate on which the damascene structure is constructed, in an electrolytic bath of acidic chemical reagents such as, for example, a copper sulfate bath. The silicon substrate is connected to the positive electrode (anode) of a DC power supply with a counter electrode, such as a platinum electrode, also immersed in the electrolyte bath, and connected to the negative electrode of the DC power supply, serving as the cathode in the electrolytic bath. All of the copper filler material lying on the diffusion barrier liner over the top surface of the low k dielectric layer is then removed, leaving only those portions of the original copper filler in the vias and trenches of the damascene structure by the electropolishing step of this embodiment of the process of the invention.

The DC power supply should be capable of proving a DC voltage up to about 5 volts DC to thereby allow the electropolishing step to be carried out at a DC voltage ranging from about 0.5 volts DC up to about 5 volts DC. In some instances a higher voltage might be used, but care must be taken not to damage the integrated circuit structure already formed on the silicon substrate. The time for the electropolishing step will range from about 10 seconds up to about 10 minutes, preferably from about 10 seconds to about 5 minutes, with the exact time dependent upon the thickness of the material to be removed during the electropolishing step, and the particular material being removed. It will be understood by those skilled in the art that the voltage and time of the electropolishing step are interrelated and that both are, in turn, dependent on the thickness of the metal to be removed by the electropolishing step. For any given thickness and type of metal to be removed, the optimum time and DC voltage may be determined empirically. The end point for the electropolishing step of the process of the invention may be determined optically, or by monitoring the current flow, or by empirical means as well.

As in the previous embodiment, the structure is then subjected to a plasma etching step to remove those portions of the barrier liner over the dielectric layer by placing the substrate on a grounded substrate support in a dry etch reactor into which is flowed a mixture of $Cl_2$ and $BCl_3$ at a flow rate of about 100 sccm $Cl_2$ and 50 sccm $BCl_3$. While maintaining a pressure of about 10 millitorr and a substrate support temperature of about 50° C., a plasma is ignited in the reactor and maintained at a power level of about 1000 watts, while the etch is monitored monochromatically. When the monitoring system indicates that all of the barrier material on the top surface of the dielectric layer has been removed, the plasma is extinguished. The substrate processed in accordance with this second embodiment of the process of the invention is then removed from the dry etch reactor free of any copper or barrier liner on the top surface of the dielectric layer, as shown in FIG. 11.

EXAMPLE 3

A Third Embodiment

Figure 13:
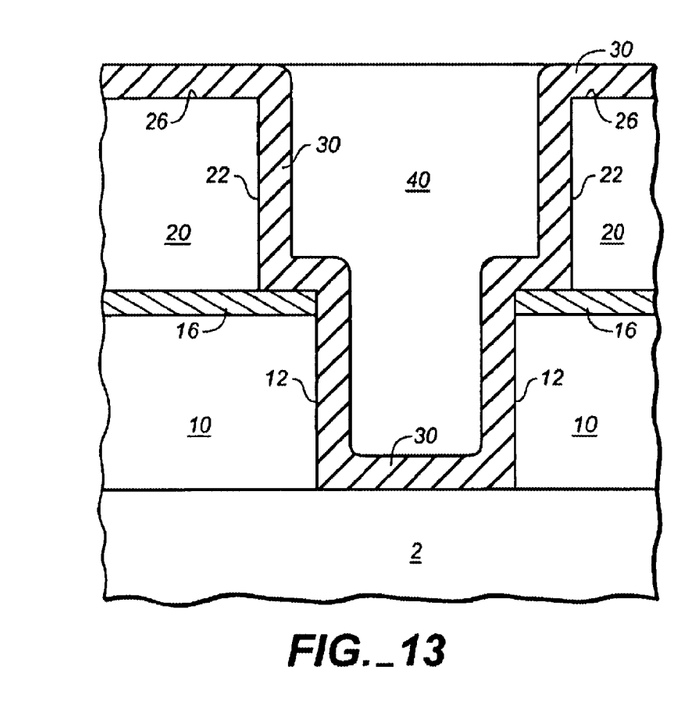
FIG. 13 is a fragmentary vertical cross-sectional view of the dual damascene structure of FIG. 1 after being subject to an electropolishing step in accordance with yet a third embodiment of the invention to remove at least all of the copper filler over the upper surface of a dielectric layer.
Figure 14:
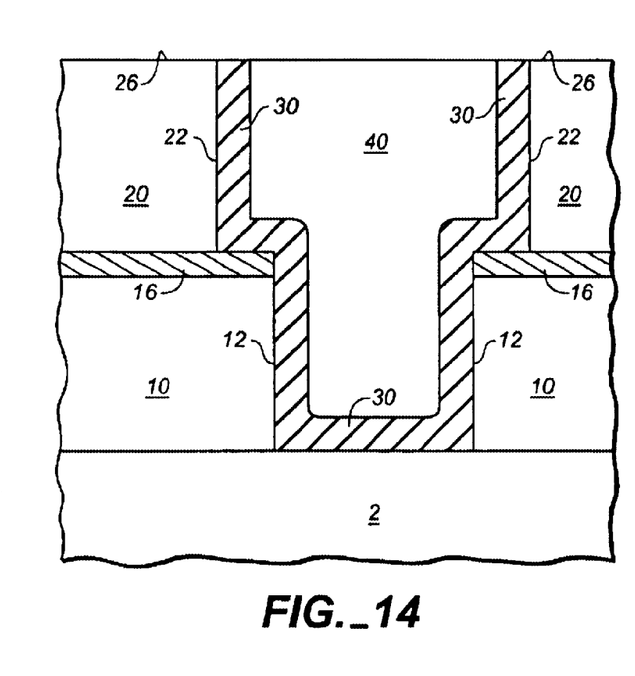
FIG. 14 is a fragmentary vertical cross-sectional view of the dual damascene structure of FIG. 13 after being subject to a plasma etching step in accordance with this third embodiment of the invention to remove any diffusion barrier liner remaining over the upper surface of the second dielectric layer after the electropolishing step.
Figure 15:
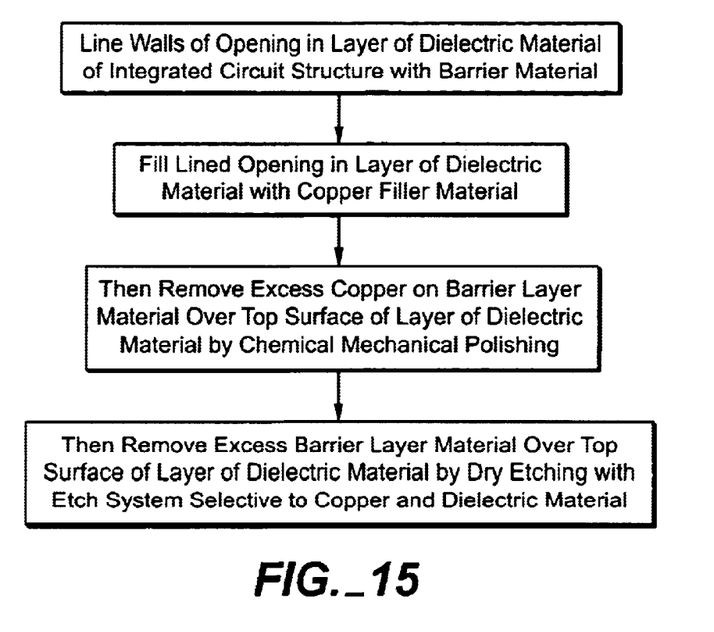
FIG. 15 is a flow sheet illustrating this third embodiment of the process of the invention.

The following example will illustrate a third embodiment of the process of the invention illustrated in FIGS. 13–15. A substrate was prepared with a layer of low k dielectric material having a pattern of trenches formed in the dielectric layers. A 20 nm thick tantalum liner was then blanket deposited over the substrate to line the trench surface on the substrate with tantalum barrier material. An 800 nm thick layer of copper metal is then blanket deposited over the substrate to fill all of the tantalum-lined trenches with copper filler. The substrate is then subject to a CMP processing using a peroxide-based polishing slurry material such as iCue5001, commercially available from Cabot, to remove at least some of the copper over the barrier liner portions on the top surface of the respective dielectric layers.

In accordance with the invention, the substrate is then placed on a grounded substrate support in a dry etch reactor into which is flowed a mixture of $Cl_2$ and $BCl_3$ at a flow rate of about 100 sccm $Cl_2$ and 50 sccm $BCl_3$. While maintaining a pressure of about 10 millitorr and a substrate support temperature of about 50° C., a plasma is ignited in the reactor and maintained at a power level of about 1000 watts, while the etch is monitored monochromatically. When the monitoring system indicates that all of the barrier material on the top surface of the dielectric layer has been removed, the plasma is extinguished. The substrate processed in accordance with the process of the invention is then removed from the dry etch reactor.

The upper surface of the copper filler material in the lined trenches of each of the substrates can then be examined for evidence of erosion and/or dishing using a step height measurement tool such as a Veeco Atomic Force Profiler. It will be found that the surfaces of the copper filler in the trenches of the substrate processed in accordance with the invention have little if any evidence of either erosion or dishing.

Having thus described the invention what is claimed is:

1. A process for planarizing an integrated circuit structure comprising at least one dielectric layer on a silicon substrate, said dielectric layer having openings therein lined with a layer of electrically conductive barrier material and filled with copper filler material, said process consisting essentially of:

a) removing, by a chemical mechanical polish (CMP) process step, a portion of the excess copper filler material over the portion of an electrically conductive barrier layer lying on the upper surface of said dielectric layer;

b) removing, by an electropolishing process step, the remainder of said excess copper filler material over said portion of said electrically conductive barrier layer lying on said upper surface of said dielectric layer to thereby expose said underlying electrically conductive barrier layer on said upper surface of said dielectric layer; and c) then removing exposed portions of said electrically conductive barrier layer on said upper surface of said dielectric layer in a dry etch reactor using a plasma etching process selective to said copper and said dielectric layer until all of said portions of said electrically conductive barrier layer over said upper surface of said dielectric layer are removed;

whereby said integrated circuit structure may be planarized by removal of all of said copper layer and said electrically conductive barrier layer from said upper surface of said dielectric layer while inhibiting dishing and/or erosion of the surface of said copper filler material in said openings dielectric layer.

2. The process of claim 1 wherein the amount of copper removed by said chemical mechanical polish (CMP) process step to remove sufficient excess copper (formed over the barrier liner portions on the top surface of the dielectric layer) to provide a planarized layer of excess copper with a global planarity of about 20 nm to about 30 nm.

3. The process of claim 2 wherein said dielectric layer comprises a layer of low k dielectric material.

4. The process of claim 2 wherein said silicon substrate, having said dielectric layer thereon, said barrier liner over said dielectric layer, and said excess copper thereon to be removed by said electropolishing process step, is immersed in an electrolytic bath of chemical reagents.

5. The process of claim 4 wherein said silicon substrate having said dielectric layer thereon, said barrier liner over said dielectric layer, and said excess copper thereon to be removed by said electropolishing process, is electrically connected to the positive electrode (anode) of a DC power supply.

6. The process of claim 5 wherein a counter electrode is also mounted in said electrolytic bath and said counter electrode is electrically connected to the negative electrode of said DC power supply.

7. The process of claim 6 wherein said DC power supply is capable of providing a DC voltage range of from about 0.5 volts DC to about 5 volts DC.

8. The process of claim 7 wherein said excess copper is removed from said barrier liner on said surface of said dielectric layer by said electropolishing process during a period of from about 10 seconds to about 10 minutes while maintaining, between said silicon substrate and said counter electrode, a DC potential ranging from about 0.5 volts to about 5 volts.

9. The process of claim 7 wherein said excess copper is removed from said barrier liner on said surface of said dielectric layer by said electropolishing process during a period of from about 10 seconds to about 5 minutes while maintaining, between said silicon substrate and said counter electrode, a DC potential ranging from about 0.5 volts to about 5 volts.

10. The process of claim 2 wherein, after removal of said excess copper, said barrier liner is removed from said upper surface of said dielectric layer by contacting said exposed portions of said barrier liner, in a dry etch reactor, with a plasma ignited while flowing through said dry etch reactor one or more gases selected from the group consisting of $Cl_2$, $CF_4$, $SF_6$, $C_4F_8$, and $BCl_3$.

11. The process of claim 10 wherein said plasma is maintained at a power level ranging from about 5 watts to about 1500 watts.

12. The process of claim 11 wherein said reactor is maintained within a pressure range of from about 3 millitorr to about 1000 millitorr during said dry etch process.

13. The process of claim 12 wherein the temperature of said integrated circuit substrate is at least about $-50°$ C. during said dry etching process.

14. The process of claim 12 wherein the temperature of said integrated circuit substrate does not exceed about $200°$ C. during said dry etching process.

15. The process of claim 10 wherein said etching of said barrier liner material is monitored monochromatically to determine the endpoint when all of the barrier liner material on the top surface of said dielectric layer has been removed.

16. A process for planarizing an integrated circuit structure comprising at least one low k dielectric layer on a silicon substrate having openings therein comprising vias and trenches lined with a layer of electrically conductive barrier liner material and filled with copper filler material which process comprises:

a) removing, by a chemical mechanical polish (CMP) first process step, a portion of the excess copper filler material over the portion of an electrically conductive barrier layer lying on the upper surface of said low k dielectric layer;

b) removing, by an electropolishing second process step, the remainder of said excess copper filler material over said portion of said electrically conductive barrier layer lying on said upper surface of said low k dielectric layer:

i) immersing said silicon substrate in an electrolytic bath;

ii) electrically connecting said silicon substrate to the positive electrode (anode) of a DC power supply;

iii) electrically connecting a counter electrode in said electrolytic bath to the negative electrode of said DC power supply to commence said electropolishing process; and iv) maintaining, between said silicon substrate and said counter electrode, a DC potential ranging from about 0.5 volts to about 5 volts for a period of from about 10 seconds to about 10 minutes to thereby remove the remainder of said copper over said barrier line on the top surface of said low k dielectric layer, and to expose said underlying electrically conductive barrier layer on said upper surface of said low k dielectric layer; and c) then removing, in a dry etch reactor, exposed portions of said electrically conductive barrier layer on said upper surface of said dielectric layer in a third plasma etching process step selective to said copper and said dielectric layer until all of said portions of said electrically conductive barrier layer over said upper surface of said dielectric layer are removed, said plasma etching step further comprising:

i) contacting said exposed portions of said barrier liner, in said dry etch reactor, with a plasma ignited while flowing through said dry etch reactor one or more gases selected from the group consisting of $Cl_2$, $CF_4$, $SF_6$, $C_4F_8$, and $BCl_3$, while maintaining said plasma at a power level ranging from about 5 watts to about 1500 watts, and said reactor within a pressure range of from about 3 millitorr to about 1000 millitorr, and a temperature of at least about −50° C. but not exceeding about 200° C. during said dry etching process; and ii) monitoring said etching of said barrier liner material to determine the endpoint when all of said barrier liner material on the top surface of said dielectric layer has been removed.

* * * * *